United States Patent

Kim et al.

[11] Patent Number: 5,541,537
[45] Date of Patent: Jul. 30, 1996

[54] HIGH SPEED STATIC CIRCUIT DESIGN

[75] Inventors: Song C. Kim; Kuan-Yu J. Lin, both of Austin, Tex.

[73] Assignee: International Business Machines Corporation, Armonk, N.Y.

[21] Appl. No.: 458,780

[22] Filed: Jun. 2, 1995

[51] Int. Cl.⁶ .................... H03K 19/0948; H03K 19/096
[52] U.S. Cl. ............... 326/121; 326/98; 326/17; 327/172
[58] Field of Search ............... 326/17, 112, 119, 326/121, 95, 98; 327/172, 176

[56] References Cited

U.S. PATENT DOCUMENTS

| | | | |
|---|---|---|---|
| 4,563,598 | 1/1986 | Oritani | 326/98 |
| 4,645,952 | 2/1987 | van Tran | 326/121 |
| 4,649,296 | 3/1987 | Shoji | 326/121 |
| 4,763,023 | 8/1988 | Spence | 326/98 |
| 4,769,562 | 9/1988 | Ghisio . | |
| 4,968,903 | 11/1990 | Smith et al. | 326/121 |
| 4,985,643 | 1/1991 | Proebsting . | |
| 5,015,882 | 5/1991 | Houston et al. . | |
| 5,121,003 | 6/1992 | Williams . | |
| 5,265,064 | 11/1993 | Davies et al. | 326/95 |
| 5,343,090 | 8/1994 | Proebsting . | |

*Primary Examiner*—Edward P. Westin
*Assistant Examiner*—Jon Santamauro
*Attorney, Agent, or Firm*—Kelly K. Kordzik; Winstead Sechrest & Minick P.C.; Mark E. McBurney

[57] ABSTRACT

Logic circuitry utilizing the advantages of static and dynamic design techniques utilize feed-forward from the inputs to the logic circuit and feed-back from the output of the logic circuit in order to provide a RESET signal to precharge the logic circuit to a predetermined state. This technique also provides for initialization of the circuit before the arrival of data input signals.

2 Claims, 4 Drawing Sheets

HIGH SPEED STATIC CIRCUIT DESIGN

TECHNICAL FIELD OF THE INVENTION

The technical field of the invention pertains in general to logic circuits and, in particular, to a static circuit design for logic circuitry with CMOS technology.

BACKGROUND OF THE INVENTION

Binary circuits are extensively used in computer systems to carry out instructions and arithmetical processes. Any logical procedure may be effected by using a suitable combination of basic logic gates. Thus, logic circuits are building blocks of computer systems. And, CMOS is often the preferred technology for such logic circuits.

There are two commonly recognized methods of logic circuit design: static and dynamic. Dynamic refers to any device or circuit in which the signals decay over a period of time unless regenerated. The CMOS random access memory is a particular example of this type of device. Any component, circuit, or device that is not dynamic or that is operated with essentially constant electrical conditions is described as static.

To meet the demand for higher performance microprocessors, the above design techniques must inevitably evolve. Meeting performance requirements is usually accomplished by using high speed dynamic circuits along critical paths. However, the dynamic circuit design has the following disadvantages when compared to a static circuit design, regardless of whether the dynamic design is self-resetting (as in a SR-CMOS logic circuit), or clocked pre-charged (as in domino logic circuitry):

1. Higher power consumption;
2. External reset generation requirement;
3. Complicated reset timing requirement;
4. Power-On Reset ("POR") signal required to initialize circuit;
5. Overhead circuitry needed for conversion of dynamic to static-like behavior during test mode.

Thus, to obtain maximum speed performance, dynamic circuit design techniques must sacrifice the robustness attainable from a static circuit. However, in spite of the robustness and lower power dissipation of static circuits, they experience current overlap during a state transition, which unnecessarily dissipates power and reduces speed.

Therefore, there is a need in the art for a logic circuit design that combines the advantages of static and dynamic design techniques, but avoids many of their respective disadvantages.

SUMMARY OF THE INVENTION

The present invention satisfies the foregoing need by providing a circuit design for CMOS implemented logic circuitry that utilizes feed-forward and feed-back paths in order to reset the logic circuit to a predetermined and specific state.

Typically, CMOS-implemented logic circuitry utilizes an N-tree for receiving inputted logic signals. The N-tree is coupled between a ground potential and a node within the logic circuit. A P-channel FET (field effect transistor) is also coupled between a power supply voltage and this node. A reset signal is delivered to the gate electrode of the P-FET device in order to precharge the node to a specific voltage level. The reset signal is provided by a logical combination of signals received from the inputs to the logic circuit and from the output of the logic circuit. This logical combination insures that the reset signal will be appropriately applied to precharge the circuit.

The present invention combines the advantages of both static and dynamic circuit design techniques. An advantage of the present invention is that it provides high dynamic circuit speed.

Yet another advantage of the present invention is that it provides a low input capacitance.

Yet still another advantage of the present invention is that it does not require external reset generation circuitry.

And another advantage of the present invention is that it does not require a set-up and hold time. It also minimizes state transition current overlap.

Another advantage of the present invention is that it provides for low power consumption. Moreover, the output of the logic circuit is valid for the entire cycle.

And, yet another advantage of the present invention is that it provides for self-recovery due to inputted noise signals. Furthermore, an advantage of the present invention is that no power-on reset signal is required since the logic circuit is self-initializing.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWING

For a more complete understanding of the present invention, and the advantages thereof, reference is now made to the following descriptions taken in conjunction with the accompanying drawings, in which.

DETAILED DESCRIPTION OF A PREFERRED EMBODIMENT OF THE INVENTION

Figure 1:
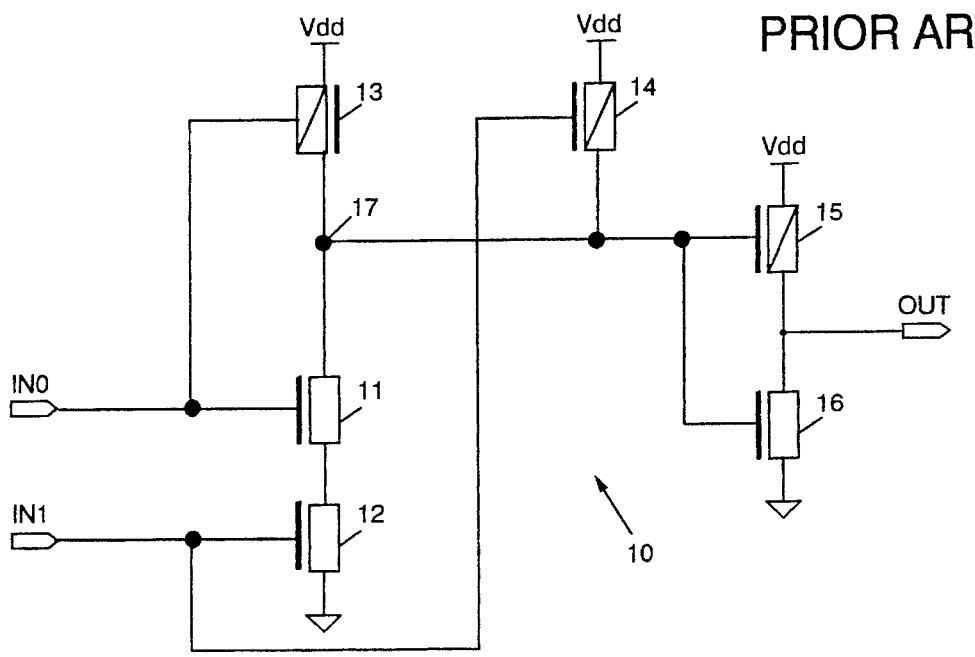
FIG. 1 illustrates a prior art logic circuit.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Referring to FIG. 1, there is illustrated logic circuit 10 operable for performing an AND logical operation on input signals IN0 and IN1. Logic signals IN0 and IN1 are received by the gate electrodes of N-FET devices 11 and 12, respectively. N-FET devices 11 and 12 form an N-tree between node 17 and a ground potential. Other N-tree configurations are adaptable to the present invention. If either of the input signals IN0 or IN1 is a logical 0, then its respective N-FET device will not turn on. Input signals IN0 and IN1 are coupled to the gate electrodes of P-FET devices 13 and 14, respectively, which are coupled between voltage supply Vdd and node 17. If either of the input signals IN0 or IN1 is a logical 0, then its coupled P-FET device will turn on and pull node 17 to a logical 1, or high, potential. This logical 1 potential will be inverted by an inverter circuit comprising P-FET device 15 and N-FET device 16, which is coupled to the output of circuit 10. Thus, as expected, if either of the input signals IN0 or IN1 is a logical 0, then the output of logic 10 will also be a logical 0 since the high potential at node 17 will be inverted before transferred to the output terminal OUT.

However, if both the input signals IN0 and IN1 are at a logical 1 level, then the voltage level at node 17 will be discharged through N-FET devices 11 and 12, which provide the ground potential, or logical 0 potential, to node 17. This level is then inverted to a logical high signal for transmission on output terminal OUT.

Therefore, as expected, circuit 10 provides a logical operation on input signals IN0 and IN1 in accordance with the following truth table:

| IN0 | IN1 | OUT |
| --- | --- | --- |
| 0 | 0 | 0 |
| 0 | 1 | 0 |
| 1 | 0 | 0 |
| 1 | 1 | 1 |

Figure 2:
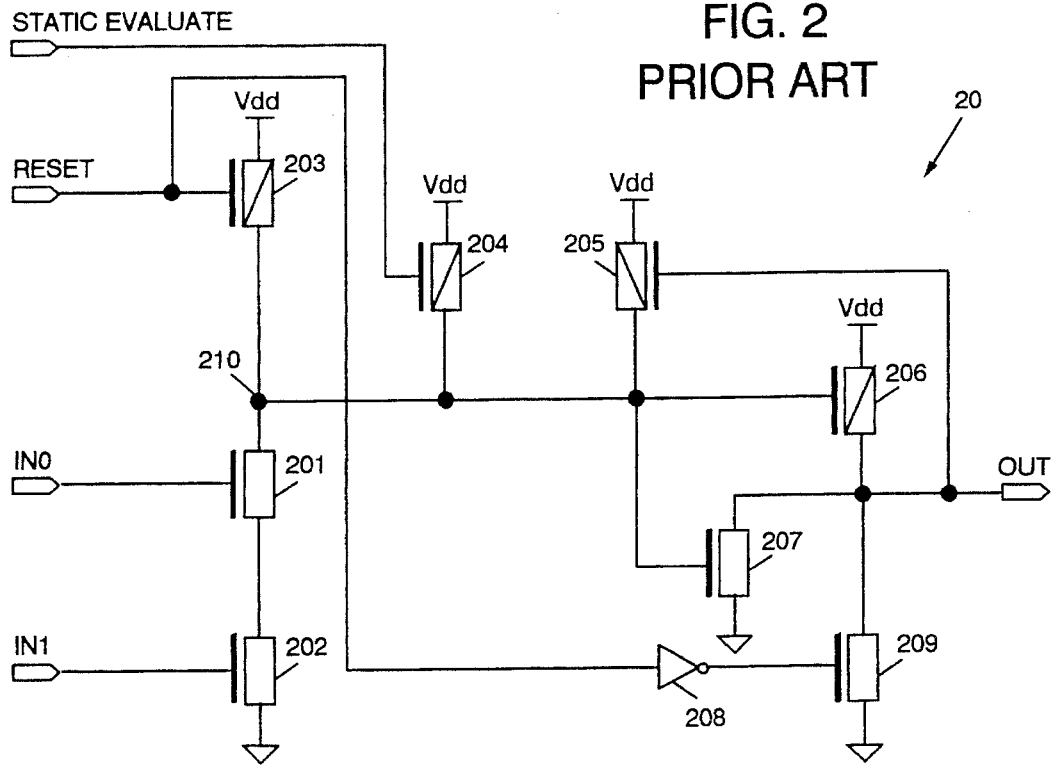
FIG. 2 illustrates another prior art logic circuit having reset capabilities.

Referring next to FIG. 2, there is illustrated logic circuit 20 demonstrating a common dynamic implementation of a "2-input AND logic circuit". Initially, both inputs are set LOW. Applying a LOW active signal as the RESET signal to the gate electrode of P-FET device 203 will precharge node 210 to Vdd through device 203. After node 210 is precharged, the RESET control signal to the gate electrode of device 203 must be turned off first before input signals IN0 and IN1 are allowed to be activated as HIGH to pull down node 210 through N-FET devices 201 and 202. Through the inverter circuit comprising P-FET device 206 and N-FET device 207, this LOW signal now present at node 210 is inverted to a HIGH signal produced at the OUT terminal. If the RESET signal does not turn off at the correct moment, an overlap current is produced during the transition described above, which unnecessarily dissipates power and reduces the speed of circuit 20. In other words, if the RESET signal is still at a LOW level when devices 201 and 202 receive the two HIGH inputs at their gate electrodes, then the power from supply Vdd will be dissipated to ground through devices 203, 201 and 202.

After the logic operation on input signals IN0 and IN1 is completed, node 210 must be precharged in preparation for the next cycle evaluation. This is accomplished by setting at least one of the inputs IN0 and IN1 back to a low state, and then reactivating the RESET control signal to a LOW state. This procedure is also dependent upon stringent timing requirements. If the RESET control signal input to device 203 activates before either IN0 or IN1 goes back to a LOW state, a collision current problem will arise. Collision current occurs in dynamic circuits when input conditions cause a direct current path from Vdd to GND. This situation is similar to "overlapping current" during a state transition in static circuits.

P-FET device 205 is a half-latch device that maintains the level of the output during an inactive state. In other words, if the level of the output at terminal OUT is a LOW signal, then this LOW signal will be provided to the gate electrode of device 205, which will drive node 210 to a HIGH state, which is then inverted to continue providing the LOW state at terminal OUT. The output signals at terminal OUT are valid only from activation of input signals to RESET of circuit 20.

Circuit 208 is an inverter used to invert the RESET signal in order to turn on device 209 which is used as a pull-down device at node OUT.

Since a dynamic circuit such as circuit 20 cannot recover from mistriggered states due to inputted noise signals, an additional P-FET device 204 must be added to circuit 20 to make it behave like a "static circuit" during the test mode called "static evaluate" for self-resetting CMOS circuit designs. Static Evaluate is a test mode under which a RESET signal to dynamic circuits is disabled. The "static evaluate" signal is used to provide a pre-charged signal to pull up a dynamic node, node 210 in this case. This signal is constantly LOW during the test mode, thus charging the dynamic node to Vdd while evaluation path is not active. When the evaluation path is turned on, the "static evaluate" device (device 204 in this case) will not corrupt the evaluation path since this device is sized to be only fractions of the evaluation devices (devices 201 and 202). Thus, via the static evaluate test, one can conclusively determine whether a dynamic circuit functions logically correct without other factors which might contribute to its failure, for example noise or stringent reset timing.

Figure 3:
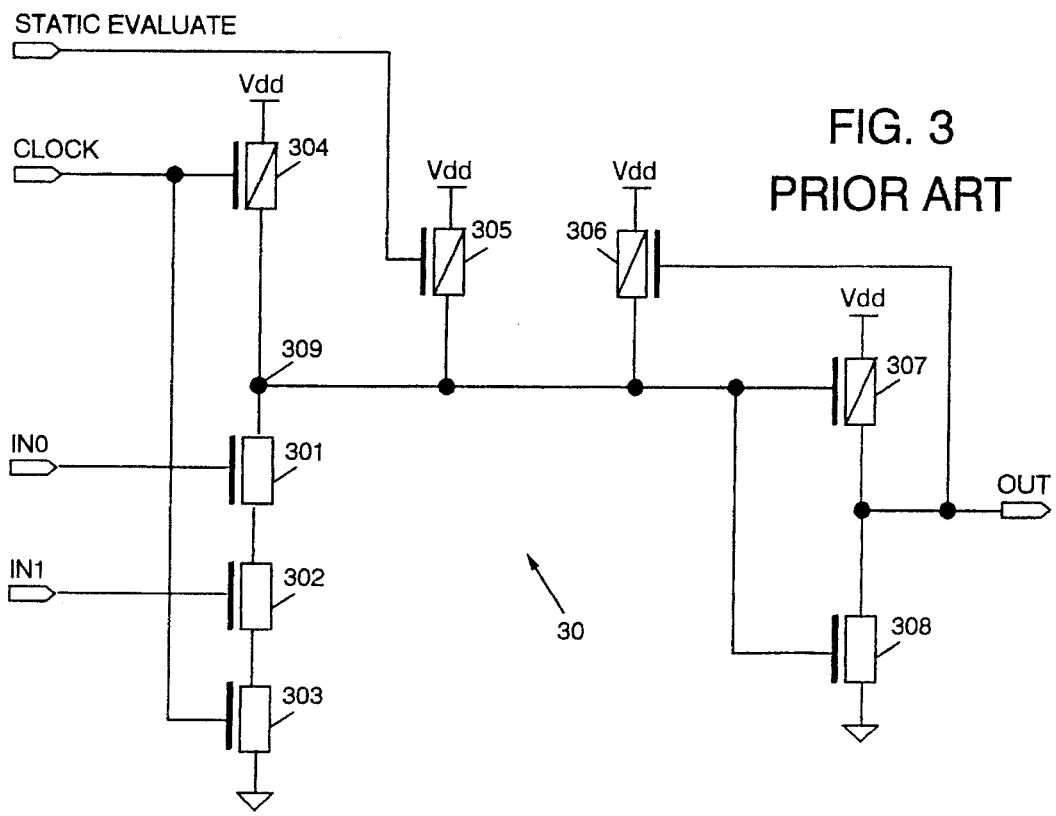
FIG. 3 illustrates another prior art logic circuit using domino logic.

Referring next to FIG. 3, there is illustrated "domino" AND circuit 30, which has node 309 RESET by the LOW level of the CLOCK signal received at the gate of device 304. The CLOCK signal is also provided to the gate electrode of N-FET device 303. The remainder of circuit 30 with respect to circuit elements 301, 302, 305, 306, 307 and 308 is as previously described with respect to FIGS. 1 and 2. The problem with circuit 30 is that it requires the input of a CLOCK signal in order to RESET node 309 for each cycle. Another problem with such a design is that each and every logic circuit within the entire VLSI designed chip is supplied with this CLOCK signal, increasing hardware and power dissipation.

Figure 4:
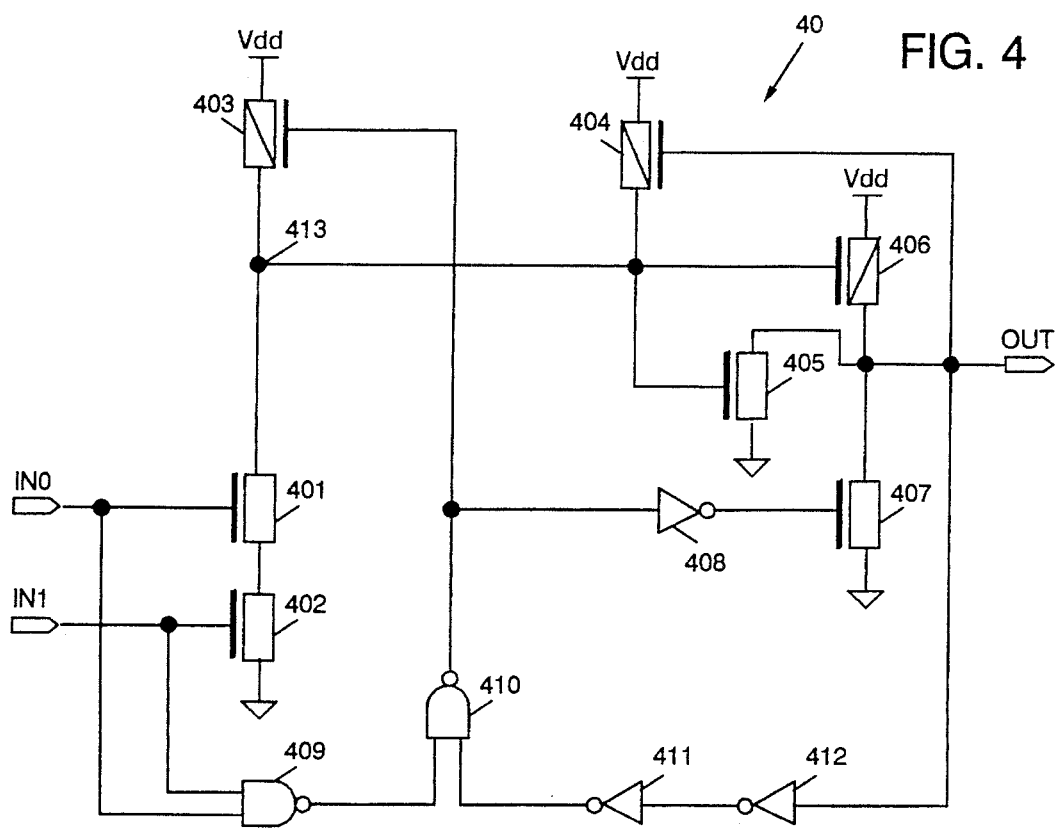
FIG. 4 illustrates an AND circuit in accordance with the present invention.

Referring next to FIG. 4, there is illustrated logic circuit 40 configured in accordance with the present invention. Circuit 40 is a two-input AND circuit. However, any number of inputs may be utilized within the AND circuit 40. Circuit 40 is essentially the same as circuits 20 and 30 in its performance of the AND logical operation and is faster than circuit 10. However, circuit 40 does not utilize an externally provided CLOCK or RESET signal or even a static evaluate signal. Essentially, the only outside signals required by circuit 40 are the data input signals IN0 and IN1, the data output signal OUT, and the voltage supply (Vdd) and ground reference signals. This is advantageous in that it requires less external hardware interfaces. Circuit 40 has a lower input capacitance than that of circuit 10. This is because conventional static circuits need to drive both the N-FET and its complimentary P-FET. Circuit 40 does not need to drive complimentary P-FETs (like most other dynamic circuits). Thus, an advantage of circuit 40 is that it is essentially self-timing and does not rely upon the timing of externally provided RESET signals.

The RESET signal as described above with respect to FIG. 2 is now provided internally by the addition of logical circuit elements 409–412. The input signals IN0 and IN1 are also inputted into NAND circuit 409, which has its output coupled to an input of NAND circuit 410. The other input of NAND circuit 410 is coupled to output terminal OUT. In order to provide correct timing with respect to the operation of the present invention, inverter circuits 411 and 412 may be supplied between output terminal OUT and NAND circuit 410. Note, buffer circuits could also be utilized here.

The output of NAND circuit 410 provides the RESET signal to the gate electrode of P-FET device 403. The output of NAND circuit 410 is also coupled through inverter circuit 408 to the gate electrode of N-FET device 407, which is also coupled to output terminal OUT. The purpose of devices 407 and 408 is similar to that of devices 208 and 209 described above.

N-FET devices 401 and 402 provide the N-tree at the input of circuit 40. Node 413 is precharged by P-FET device 403, and is coupled through the inverter circuit supplied by P-FET device 406 and N-FET device 405 to output terminal OUT.

By adding elements 409–412, circuit 40 now operates like a static design logic circuit, eliminating the requirement for an externally provided Reset input. Thus, the output is valid for the entire cycle. In addition, because circuit 40 operates like a normal static circuit, initialization "POR" is not required. Also, the combining characteristics of non-overlapped current during a state charge and low input capacitances result in dynanmic circuit speed performance in its critical path evaluation (when both inputs equal a logical 1, the output transitions from a 0 to 1 mode).

The operation of circuit 40 begins with both inputs initially LOW. Node 413 should be at a HIGH level. If node 413 is not HIGH for some reason, the initial output will be HIGH and precharge device 403 will be turned on through the operation of devices 409–412, charging node 413 to a high state. When node 413 is charged to a HIGH state, output terminal OUT will be set to a LOW state and device 403 will then be turned off through the feedback path 412, 411 and 410. Thus, an initialization signal is not needed.

After device 403 is turned off, small keeper device 404 operates to maintain node 413 at a high state.

When both inputs IN0 and IN1 are activated to a HIGH state, node 413 will be discharged through devices 401 and 402, resulting in the output being set to a HIGH state. Since device 403 was already turned off, an overlap current problem is avoided. The output at terminal OUT will remain high until either of the inputs IN0 or IN1 changes state. When either input IN0 or IN1 moves to a LOW state, device 403 will charge node 413 to a HIGH state through devices 409 and 410, causing the outputs at terminal OUT to move to a LOW state. After the output moves to a LOW state, device 403 will be turned off through the feedback path 412, 411 and 410, and node 413 will be maintained at a high state using the half-latch device 404.

Thus, with a combination of feed-forward and feed-back paths, circuit 40 avoids current collision and maintains a high speed performance. In addition, circuit 40 is event-driven, which reduces circuit power consumption through lowered nodal activity. This is in contrast to dynamic circuits, where a RESET signal is applied to all circuits every cycle, regardless of any precharge or recharge needs. This is especially for Row Decode circuits encountered in SRAM design. Even where only one of 256 lines has been activated, the Reset signal would be applied to all 256 lines. In case of the present invention, only the activated circuit will be recharged.

Furthermore, the design of the present invention allows for the recovery from mistriggered states due to noise inputted into inputs IN0 or IN1. The combination of feed-forward and feed-back action will restore any falsely triggered node back to its correct state.

Figure 5:
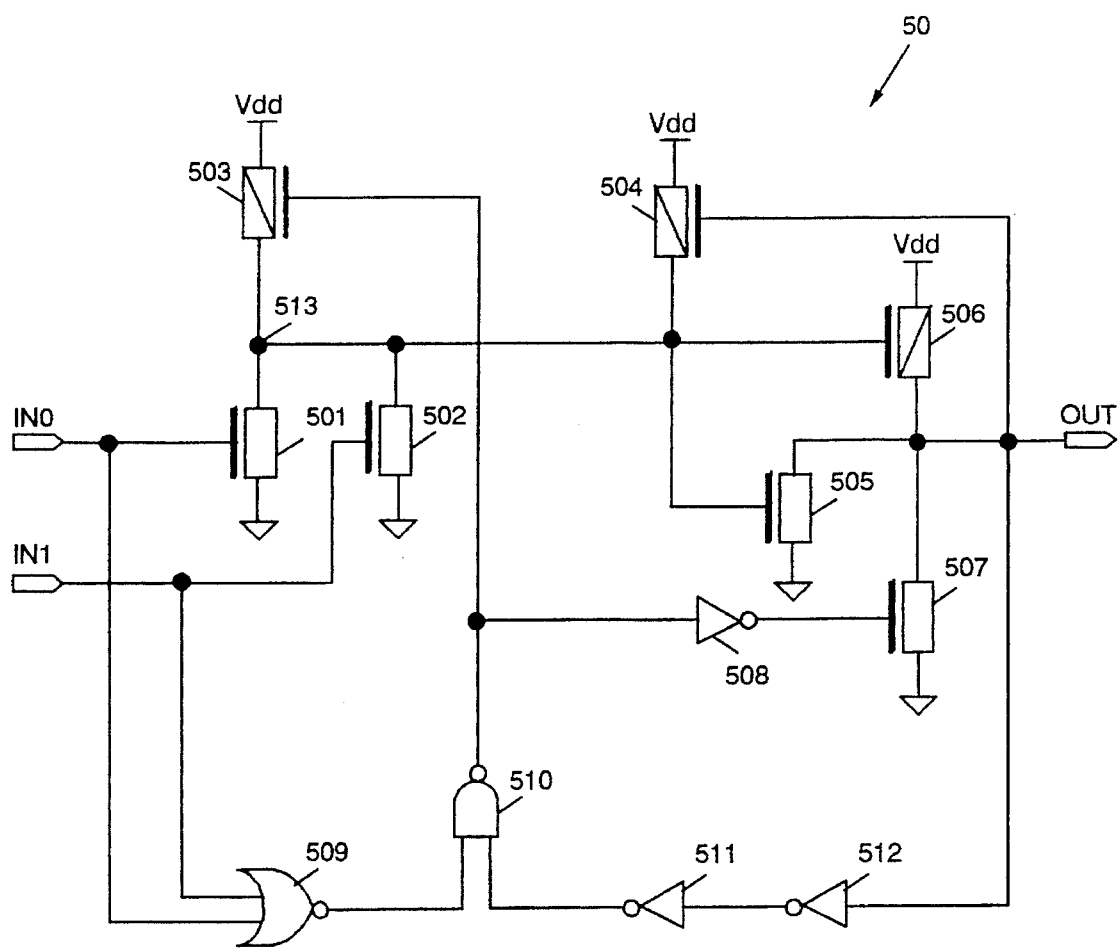
FIG. 5 illustrates an OR circuit in accordance with the teachings of the present invention.
Figure 6:
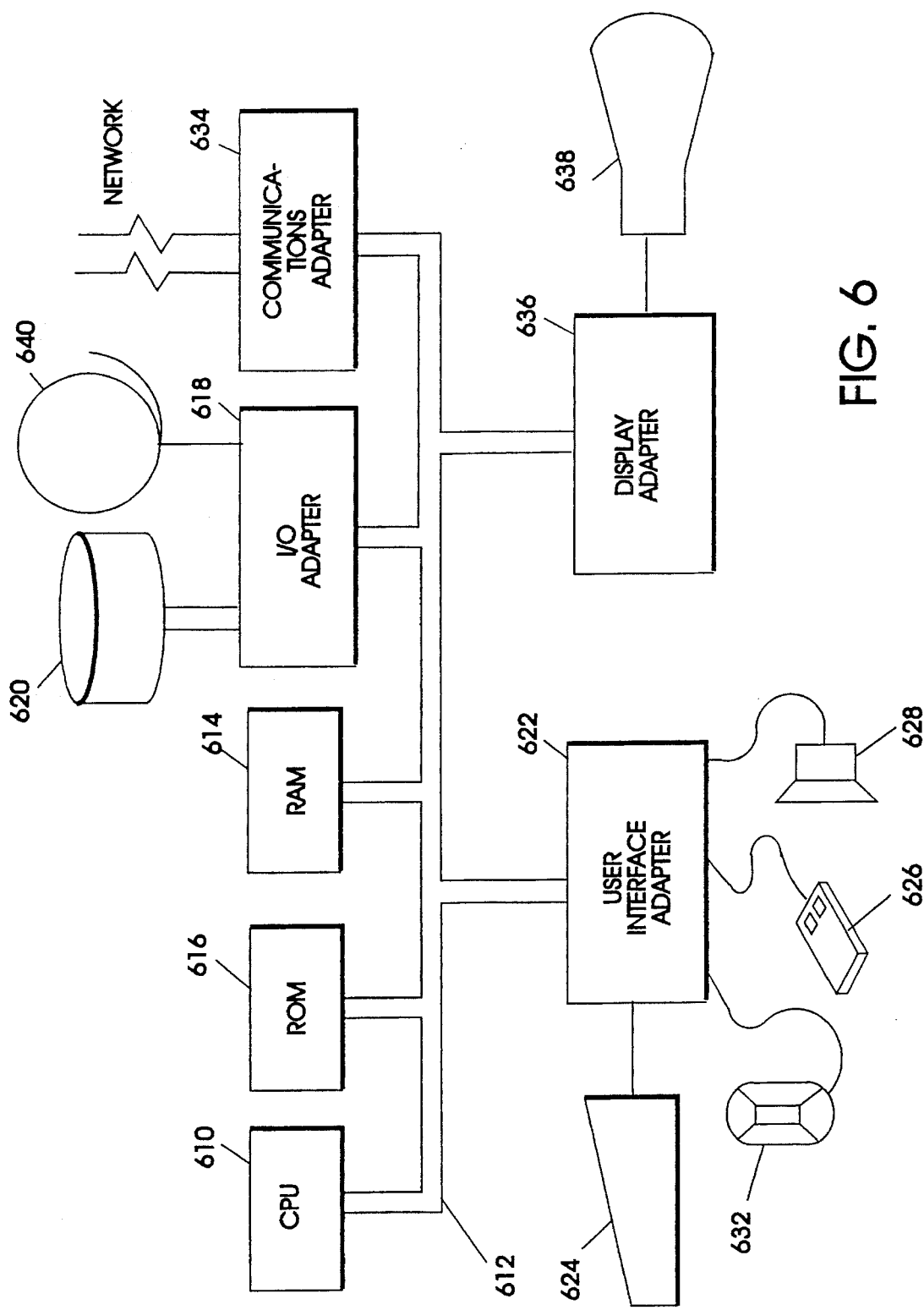
FIG. 6 illustrates a data processing system configurable in accordance with the present invention.

Referring next to FIG. 5, there is illustrated circuit 50 which is a logical OR circuit implemented in accordance with the present invention. Essentially, the circuit is similar to that of FIG. 4. The N-tree comprising N-FET devices 501 and 502 operates to provide the OR logical function to inputs IN0 and IN1. Node 513 corresponds to Node 413. P-FET device 503 corresponds to device 403. Keeper device 504 corresponds to device 404. The inverter circuit comprising devices 506 and 505 corresponds to devices 406 and 405. Devices 507 and 508 correspond to devices 408 and 407. And, devices 509–512 correspond to devices 409–412. The exception here is that NOR circuit 509 now replaces NAND circuit 409 of circuit 40 in order to correspond to the logical OR function performed by circuit 50 in order to provide the RESET signal to the gate electrode of device 503 at the appropriate time.

The above circuits do not get all of their advantages for free. There are required a few more elements than a standard dynamic circuit. However, the overhead in adding these parts is minimal since the elements do not lie in its critical path and can therefore be of minimal size. In the case of circuit 40, the critical path is the path that discharges node 413 to ground and node OUT to Vdd. All other paths "act" as reset path in a dynamic circuit environment. This invention is meant to be used in a dynamic circuit environment. Note, the reset path does not need to be fast. As long as the circuit resets itself before the next cycle, no performance is gained or lost. Note, the combined size may actually be smaller than an N-FET clocked domino circuit. An example of total gate size estimates for various types of AND gates is shown below:

| FIG. | Type | Total Gate Size |
| --- | --- | --- |
| 2 | SR-CMOS | 175.5 microns |
| 1 | STATIC AND | 182 microns |
| 4 | High Speed STATIC AND of the present invention | 207.9 microns |
| 3 | Domino AND | 220 microns |

The techniques discussed above with respect to the 2-input AND and OR circuits may be applied to other logical circuits in a similar manner. The teachings herein should provide enough information so that one may apply these teachings to such circuits in a similar manner as discussed herein with respect to the present invention.

Although the present invention and its advantages have been described in detail, it should be understood that various changes, substitutions and alterations can be made herein without departing from the spirit and scope of the invention as defined by the appended claims.

What is claimed is:

1. A logic circuit comprising:

an input means for receiving two or more digital data signals;

first and second N-FETs having their gate electrodes connected to said input means, wherein said first and second N-FETs are connected in series between a node and a first voltage source;

a first P-FET connected between a second voltage source and said node;

a second P-FET having its gate electrode coupled to said node, wherein said second P-FET is connected between said second voltage source and an output terminal;

a third N-FET having its gate electrode coupled to said node and being connected between said first voltage source and said output terminal;

a third P-FET connected between said second voltage source and said node and having its gate electrode coupled to said output terminal;

a fourth N-FET connected between said first voltage source and said output terminal;

a first NAND circuit having its inputs connected to said input means;

a second NAND circuit having one of its inputs connected to an output of said first NAND circuit and having a second input coupled to said output terminal, wherein an output of said second NAND circuit is connected to a gate electrode of said first P-FET; and an inverter circuit having an input connected to said output of said second NAND circuit, wherein an output of said inverter circuit is connected to a gate electrode of said fourth N-FET.

2. A logic circuit comprising:

two or more input terminals for receiving two or more digital data signals;

first and second N-FETs coupled in parallel between a node and a first voltage source, wherein gate electrodes of said first and second N-FETs are connected to said two or more input terminals;

a first P-FET connected between a second voltage source and said node;

an output terminal;

a second P-FET connected between said second voltage source and said output terminal, wherein a gate electrode of said second P-FET is connected to said node;

a third P-FET connected between said second voltage source and said node, wherein a gate electrode of said third P-FET is connected to said output terminal;

a third N-FET connected between said output terminal and said first voltage source, wherein a gate electrode of said third N-FET is connected to said node;

a fourth N-FET connected between said output terminal and said first voltage source;

a NOR circuit having its inputs connected to said two or more input terminals;

a NAND circuit having a first input coupled to said output terminal and a second input connected to an output of said NOR circuit, wherein an output of said NAND circuit is connected to a gate electrode of said first P-FET; and an inverter circuit having its input connected to an output of said NAND circuit and having its output connected to a gate electrode of said fourth N-FET.

* * * * *